United States Patent
Suntio et al.

(10) Patent No.: US 6,313,399 B1
(45) Date of Patent: Nov. 6, 2001

(54) COOLING ELEMENT FOR AN UNEVENLY DISTRIBUTED HEAT LOAD

(75) Inventors: Teuvo Suntio, Klaukkala; Jarmo Mäki, Orimattila, both of (FI)

(73) Assignee: Muuntolaite Oy, Vantaa (FI)

( * ) Notice: Subject to any disclaimer, the term of this patent is extended or adjusted under 35 U.S.C. 154(b) by 0 days.

(21) Appl. No.: 09/554,797

(22) PCT Filed: Nov. 23, 1998

(86) PCT No.: PCT/FI98/00915

§ 371 Date: Aug. 14, 2000

§ 102(e) Date: Aug. 14, 2000

(87) PCT Pub. No.: WO99/27761

PCT Pub. Date: Jun. 3, 1999

(30) Foreign Application Priority Data

Nov. 21, 1997 (FI) .................................................. 974293

(51) Int. Cl.[7] .................................................. H05K 7/20
(52) U.S. Cl. ........................... 174/17 VA; 174/16.3
(58) Field of Search ..................... 174/17 VA, 16.1, 174/16.3; 361/704; D13/152

(56) References Cited

U.S. PATENT DOCUMENTS

| | | | |
|---|---|---|---|
| D. 379,088 | * 5/1997 | Hopper | D13/152 |
| 4,884,630 | * 12/1989 | Nelson et al. | 165/170 |
| 4,953,634 | * 9/1990 | Nelson et al. | 165/147 |
| 5,019,880 | * 5/1991 | Higgins, III | 357/81 |
| 5,597,034 | * 1/1997 | Barker, III et al. | 165/80.3 |
| 5,661,638 | * 8/1997 | Mira | 361/697 |
| 5,709,263 | * 1/1998 | Mira | 165/80.3 |
| 6,196,300 | * 3/2001 | Checchetti | 165/80.3 |
| 6,196,302 | * 3/2001 | Chuang | 165/122 |
| 6,199,624 | * 3/2001 | Wotring | 165/80.3 |

\* cited by examiner

*Primary Examiner*—Dean A. Reichard
*Assistant Examiner*—Angel R. Estrada
(74) *Attorney, Agent, or Firm*—Greenberg Traurig LLP

(57) ABSTRACT

For cooling an encased electric device (100) by means of the convection flow of a medium, a cooling element (400) is attached to device (100), said cooling element includes a back plate and ribs (401) fastened to device (100) at certain distances. The width of at feast one space (402) between the ribs is different at different points. The width of the spaces (402) between the ribs is at the widest at the points of the cooling element which, in the intended position of use of the cooling element, are downwards and/or sidewards, and at the narrowest at the points of the cooling element at which the electric device (100) contains a component that produces a lot of heat during use.

3 Claims, 2 Drawing Sheets

COOLING ELEMENT FOR AN UNEVENLY DISTRIBUTED HEAT LOAD

FIELD OF THE INVENTION

In general, the invention relates to the structure of cooling elements in electric devices. In particular, the invention relates to a cooling element in which the cooling of an unevenly distributed heat load can be intensified.

SUMMARY OF THE INVENTION

In electric devices part of the electric energy is converted into heat, as a result of which the electric device warms up at some points. In electric devices, which are encased and contain electronic components, points that warn up particularly strongly are, for example, power transistors and other power semiconductors, which are used as amplifiers or as electronically controlled power switches. In order to make sure that the warming up of the component will not impede the operation of the device, as high a proportion of the heat as possible must be conducted away from the device. Active cooling with fans or Peltier elements is possible in certain cases, but in most cases cooling takes place by means of the convection of the ambient air or some other medium.

FIG. 1 shows an encased electric device 100, which contains three components 101, 102 and 103 that produce a lot of heat. In order to achieve convection cooling according to the prior art, these components are fastened in the device so that the heat of the components is conducted to the metallic outer surface 104 of the device, to which surface the cooling element 105 is fastened. Cooling element 105 comprises back plate 107 which supports cooling ribs 106. FIG. 2 shows the device with its cooling elements seen from the side of the cooling element. The heat produced in the components 101, 102 and 103 is conducted via the metallic outer surface of the device to the cooling element 105, which is thereby heated at certain points. From the ribs 106 of the cooling element at the hot components the heat is conducted to the ambient air, which rises upwards when it warms up. Cooler air flows from below to replace it, and this in turn warms up and starts rising upwards, whereby the cooling convection air flow indicated by arrows in FIG. 2 is formed.

The solution shown in FIG. 2 has the problem that the intake of the cooling air takes place at a relatively narrow area 201. This drawback is emphasized if the device 100 with its cooling elements is installed in a rack, and another device is installed immediately beside it. If there are also other devices in the rack below the device being examined, it is possible that the air that flows from below between the cooling ribs is already warm, whereby the cooling is not very efficient. In order to achieve sufficient cooling, the cooling element 105 must be made relatively large, which reduces the efficiency of space utilization. Another alternative is to accept a substandard quality of cooling and allow a high operation temperature for the components of the electric device, but this reduces the reliablity of the device and shortens its service life.

FIG. 3 shows a known solution, which partly solves the problem of "pre-heated" cooling air. In this solution, the cooling element 301 is placed diagonally, whereby cooling air flows between its ribs at least partly from the front of the device. However, in this application the intake of the cooling air also takes place on a relatively narrow area.

The purpose of this invention is to present a cooling element, which cools an unevenly distributed beat load efficiently.

The purpose of the invention is achieved by arranging the ribs of the cooling element in a layout in which the distance between them is not constant.

The cooling element according to the invention, which comprises ribs at a certain distance from one another is characterized in that the width of at least one space between ribs is different at different points.

The problems of prior art cooling elements are mainly caused by the fact that the cooling element is usually made of an extruded aluminium profile. With the extrusion method it is possible to manufacture only profiles in which the cross-section is the same for the whole length. In the cooling element according to the invention the ribs are not placed parallelly and spaced evenly, but the spaces can become narrower and wider and the ribs can curve. In such an arrangement, the air flowing between the ribs can be guided so that it cools efficiently the parts of the device at which there are many heat-producing components. The curving ribs and the widening and narrowing spaces can also direct the intake of cooling air so that it is as cold as possible and its flow is not blocked. The cooling element according to the invention can be manufactured by casting, for example.

BRIEF DESCRIPTION OF THE DRAWINGS

In the following, the invention will be described in more detail with reference to the preferred embodiments shown by way of example, and the accompanying drawings, in which.

DETAILED DESCRIPTION OF THE INVENTION

Figure 1:
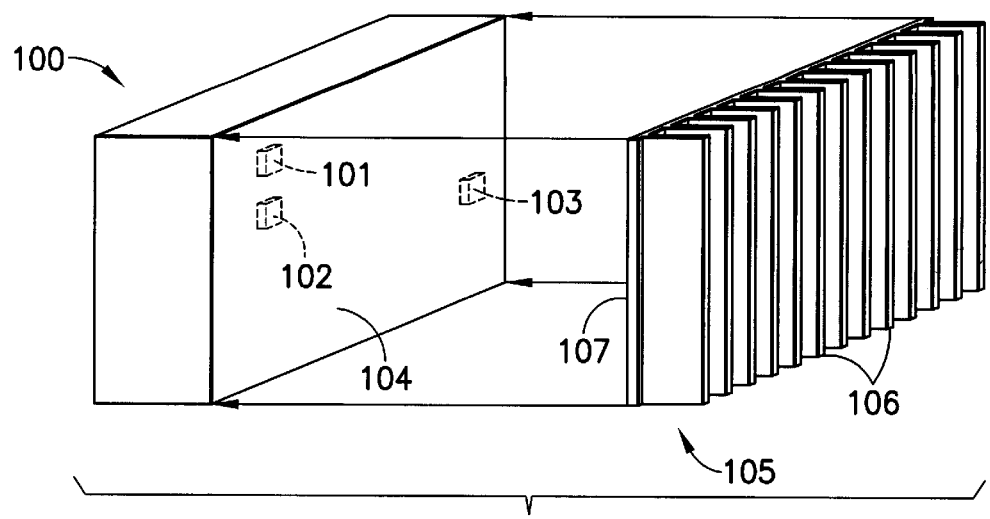
FIG. 1 shows a prior art cooling solution.
Figure 2:
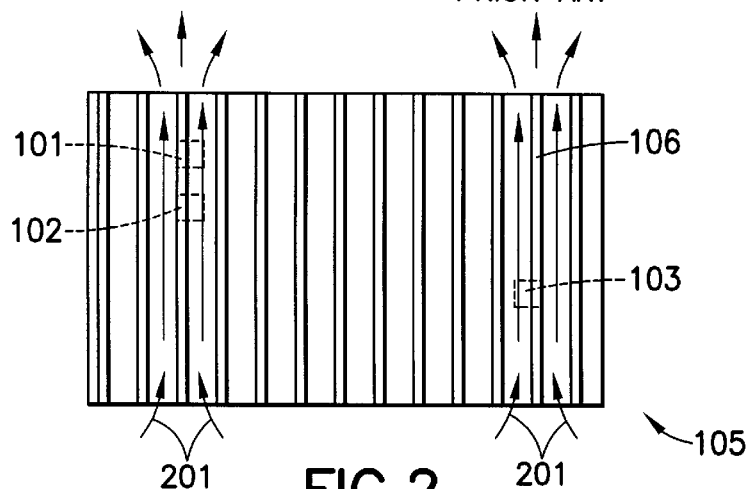
FIG. 2 shows the solution of FIG. 1 from another direction.
Figure 3:
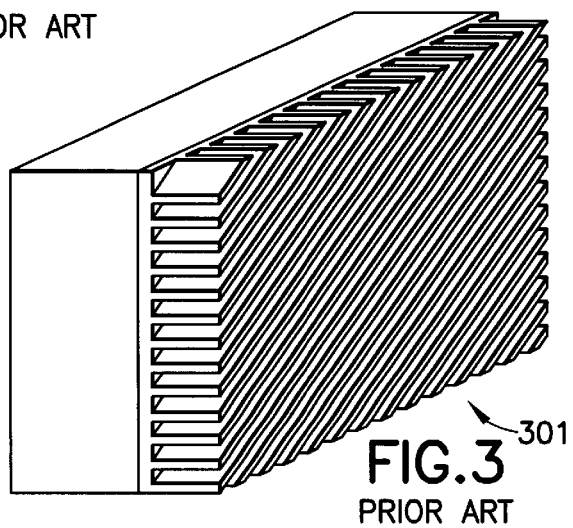
FIG. 3 shows a known variation of the solution of FIG. 1.

Above in connection with the description of the prior art, reference was made to FIGS. 1 to 3, and so in the following description of the prior art reference will be made mainly to FIGS. 4 and 5. The same reference numbers are used in the figures for corresponding parts.

Figure 4:
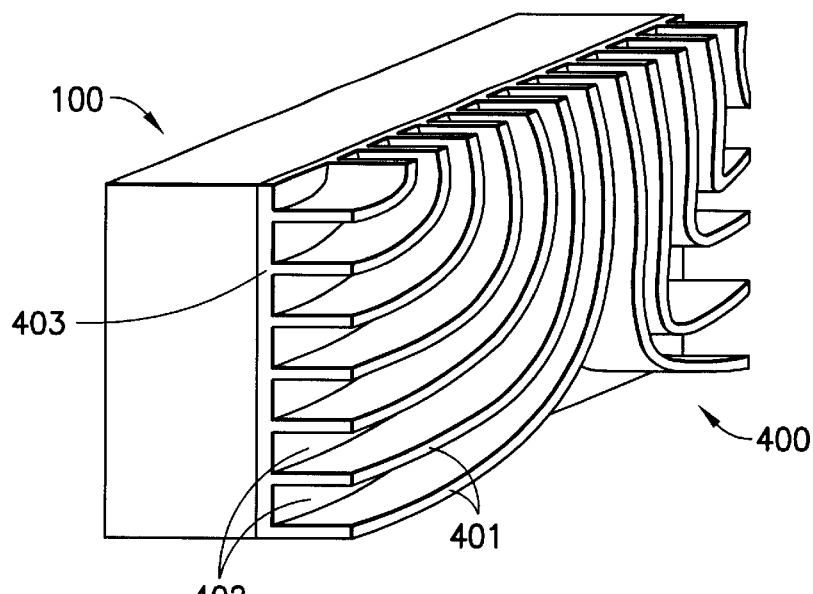
FIG. 4 shows a cooling solution according to the invention.
Figure 5A:
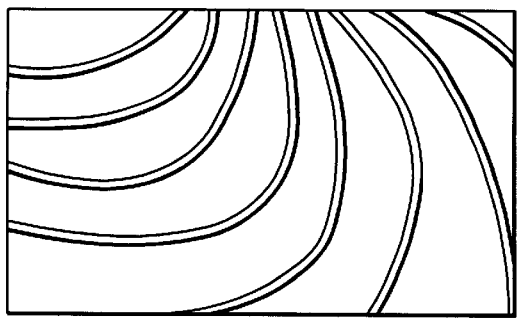
FIGS. 5a to 5d show some variations of the cooling solution according to the invention.
Figure 5B:
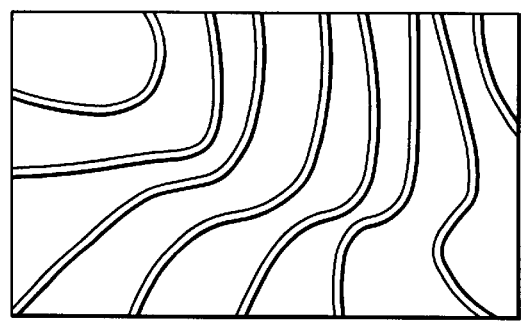
Figure 5C:
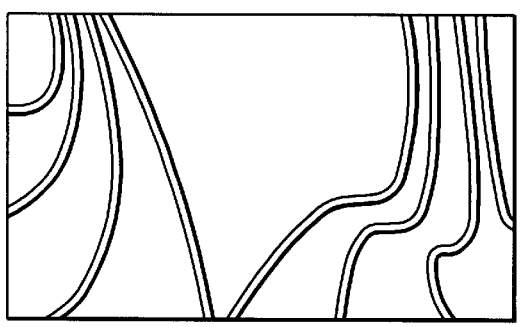
Figure 5D:
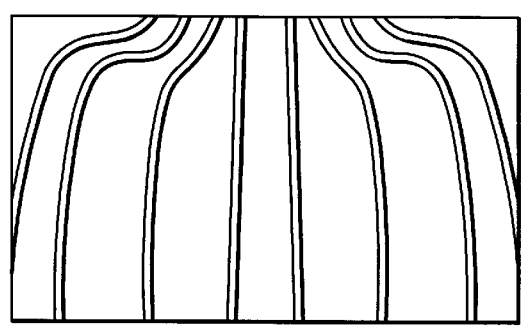

In FIG. 4, a cooling element 400 is connected to an encased electric device 100, the ribs 401 of which element are curving. Ribs 401 are supported by back plate 403. The spaces 402 between the ribs are not even, but they are typically at the widest at the points of the cooling element which in the intended position of use of the device are downwards and/or sidewards, and at the narrowest at the points at which the electric device 100 contains a component that produces a lot of heat. A narrow space between ribs at the component that produces heat causes the air flow to be accelerated from what it is at the wider parts. On the other hand, the wide space at the lower edge and/or side of the device functions as a large suction inlet, which sucks a lot of cooling air between the ribs. The intended installation environment can be taken into account by directing the spaces between the ribs downwards or sidewards: if other heat-producing devices are installed below the device, it is advantageous to direct the spaces of the ribs towards the side so that the air flowing into them would not be already warm. On the other hand, if there is plenty of free space below the device, it is advantageous to direct the spaces between the ribs downwards, because the more vertically the ribs are positioned, the less dust will gather on the surface of the ribs.

The cooling element 400 need not be a separate element, which is fastened on the surface of the case of the device 100, but it can be a part of the case. Due to the curving shapes of the ribs, the most advantageous manufacturing method for the cooling element is casting FIGS. 5a, 5b, 5c and 5d how different variations of the cooling element according to the invention as seen from the side. In each case, the point cooled most efficiently is the one in which the spaces between the ribs depicted by black lines are at the narrowest. It is clear that the invention does not in any way restrict the curving patterns formed by the ribs. In addition to the efficiency of cooing, the effect of the geometric pattern formed by the ribs can be taken into account as a factor that gives a certain first impression to the buyer and user.

What is claimed is:

1. A cooling element (400) for cooling an encased electronic device (100) by means of convection flow of a medium, said cooling element comprising a back plate and ribs (401) fastened to it at certain distances, wherein the width of at least one space (402) between the ribs is different at different points, and the spaces between the ribs are directed to open predominantly to those sides of the electric device that in the intended operational position of the electric device comprise free space, such that heat produced by components of said electric device is conducted via a metallic outer surface of said device to said ribs, which heat is then, in turn, dissipated from said ribs by a convection air flow passing within the spaces between said ribs.

2. A cooling element (400) according to claim 1, wherein the ribs (401) are curving.

3. A cooling element (400) according to claim 1, wherein the width of the space (402) between many ribs is different at different points so that the width of the spaces (402) between ribs is at the widest at the points of the cooling element which in the intended position of use of the electronic device are downwards and/or sidewards, and at the narrowest at the points of the cooling element at which said encased electric device (100) contains a component that produces a lot of heat during use.

* * * * *